United States Patent
Szeremeta

(10) Patent No.: US 8,358,395 B1
(45) Date of Patent: Jan. 22, 2013

(54) ELECTRONIC DISPLAY ASSEMBLY COMPRISING A DISPLAY MOUNT AND A FLEX CIRCUIT WRAPPED AROUND AND ADHERED TO THE DISPLAY MOUNT

(75) Inventor: Wally Szeremeta, Mission Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 497 days.

(21) Appl. No.: 12/720,602

(22) Filed: Mar. 9, 2010

(51) Int. Cl.
*G02F 1/1345* (2006.01)
(52) U.S. Cl. .......................................... 349/150; 349/58
(58) Field of Classification Search ........................ None
See application file for complete search history.

(56) References Cited

U.S. PATENT DOCUMENTS

| | | | |
|---|---|---|---|
| 5,002,368 A | 3/1991 | Anglin | |
| 5,191,515 A | 3/1993 | Hayamatsu | |
| 6,034,751 A | 3/2000 | Kamiya | |
| 6,657,606 B2 | 12/2003 | Kang et al. | |
| 6,674,506 B2 | 1/2004 | Fallon et al. | |
| 6,683,644 B1 | 1/2004 | Nakao et al. | |
| 6,727,961 B2 | 4/2004 | Yang | |
| 6,731,354 B2 | 5/2004 | Menard | |
| 6,734,926 B2 | 5/2004 | Fan et al. | |
| 6,768,524 B2 | 7/2004 | Ju | |
| 6,812,966 B1 | 11/2004 | Nakazawa | |
| 6,842,333 B2 | 1/2005 | Lee et al. | |
| 6,865,400 B2 | 3/2005 | Oh et al. | |
| 6,888,591 B2 | 5/2005 | Kim | |
| 6,909,475 B2 | 6/2005 | Kojima et al. | |
| 7,034,915 B2 | 4/2006 | Nishiki | |
| 7,076,078 B2 | 7/2006 | Peng | |
| 7,102,703 B1 | 9/2006 | Mathew et al. | |
| 7,121,516 B1 | 10/2006 | Koh | |
| 7,230,660 B2 | 6/2007 | An | |
| 7,233,382 B2 | 6/2007 | Yamaji et al. | |
| 7,233,486 B2 | 6/2007 | Kim | |
| 7,301,589 B2 | 11/2007 | Liao et al. | |
| 7,301,761 B2 | 11/2007 | Merz et al. | |
| 7,342,180 B2 | 3/2008 | Ko et al. | |
| 7,403,242 B2 | 7/2008 | Ide | |
| 7,423,704 B2 | 9/2008 | Cho et al. | |
| 7,595,979 B2 | 9/2009 | Shi et al. | |
| 2003/0035281 A1 | 2/2003 | Huang et al. | |
| 2005/0068470 A1 | 3/2005 | Won | |
| 2005/0094057 A1 | 5/2005 | Lin et al. | |
| 2005/0176486 A1 | 8/2005 | Nishimura et al. | |
| 2005/0212990 A1 | 9/2005 | Robinder | |
| 2005/0259523 A1 | 11/2005 | Kang | |

(Continued)

OTHER PUBLICATIONS

Bruce Chew, "Engineered Solutions to Help Prevent LCD Failures", EAR Specialty Composites, http://www.shockandvibe.com/pdfs/engineering/engsolutionsforLCD.pdf.

*Primary Examiner* — Thanh-Nhan P Nguyen

(57) ABSTRACT

An electronic display assembly is disclosed comprising a display mount including a window and a display coupled to the display mount. The electronic display assembly further comprises an adhesive strip comprising a first side covering at least part of the window of the display mount. A flex circuit is coupled to the display, wherein the flex circuit comprises a component surface having at least one component mounted thereon. The flex circuit is wrapped around the display mount and the component surface is adhered to the first side of the adhesive strip through the window of the display mount.

25 Claims, 7 Drawing Sheets

U.S. PATENT DOCUMENTS

| | | |
|---|---|---|
| 2005/0264984 A1 | 12/2005 | Lee |
| 2006/0238669 A1 | 10/2006 | Chiang |
| 2006/0244876 A1 | 11/2006 | Ahn |
| 2007/0006422 A1 | 1/2007 | Lu et al. |
| 2007/0126971 A1 | 6/2007 | Lo |
| 2008/0094787 A1 | 4/2008 | Kabeya |
| 2008/0111938 A1 | 5/2008 | Park et al. |
| 2008/0123017 A1 | 5/2008 | Lee |
| 2009/0016000 A1 | 1/2009 | Kobayashi |
| 2010/0039603 A1* | 2/2010 | Chen et al. .................... 349/150 |
| 2011/0025949 A1* | 2/2011 | Park .............................. 349/64 |

* cited by examiner

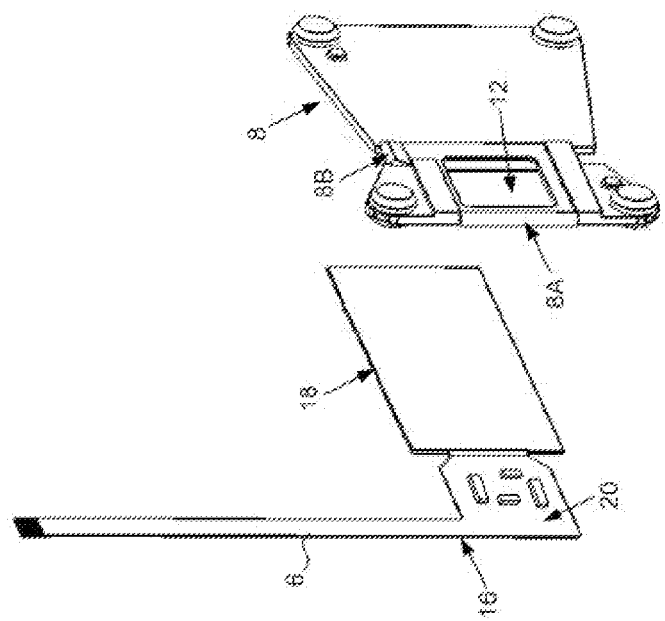
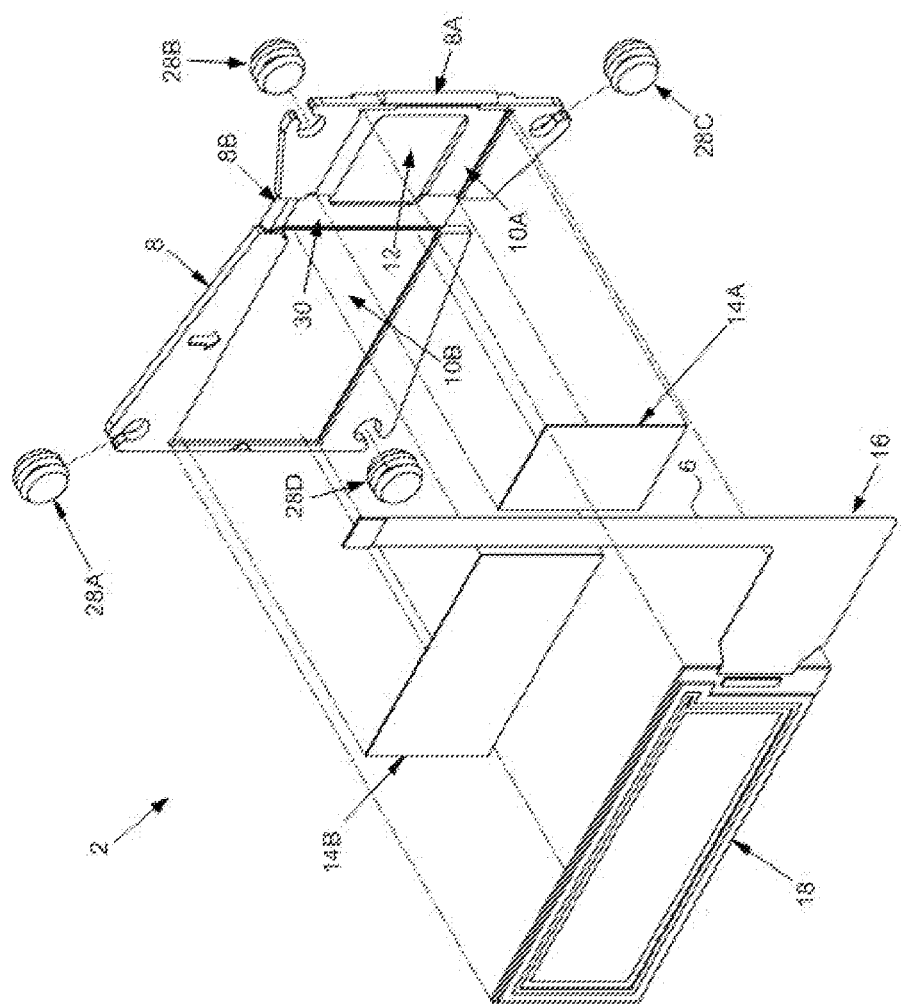
FIG 3B
FIG 3A

ELECTRONIC DISPLAY ASSEMBLY COMPRISING A DISPLAY MOUNT AND A FLEX CIRCUIT WRAPPED AROUND AND ADHERED TO THE DISPLAY MOUNT

BACKGROUND

Electronic display assemblies, such as liquid crystal display (LCD) assemblies, are ubiquitous in consumer electronic devices, such as in cell phones, portable music players, handheld game players, etc. The display technology ranges from simple segment type LCDs to more sophisticated touch screen, pixilated LCDs. To facilitate the mass production of consumer electronic devices, the display assembly should comprise cost effective components and a cost effective manufacturing procedure that minimizes damage to the components during and after manufacturing.

BRIEF DESCRIPTION OF THE DRAWINGS

FIG. 3A shows an exploded view of the electronic display assembly comprising a flex circuit for wrapping around a display mount according to an embodiment of the present invention.

FIG. 3B shows a reverse perspective of the exploded view of FIG. 3A including a component surface of the flex circuit according to an embodiment of the present invention.

DETAILED DESCRIPTION OF EMBODIMENTS OF THE INVENTION

Figure 1A:
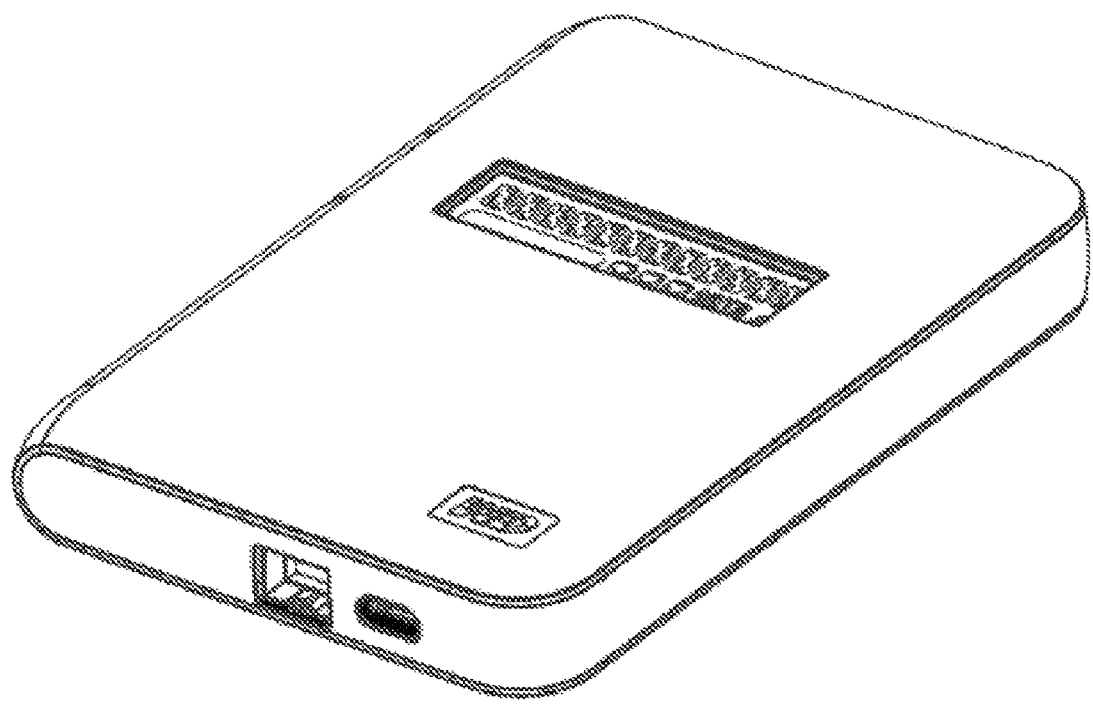
FIG. 1A shows a portable disk drive comprising an electronic display assembly according to an embodiment of the present invention.
Figure 1B:
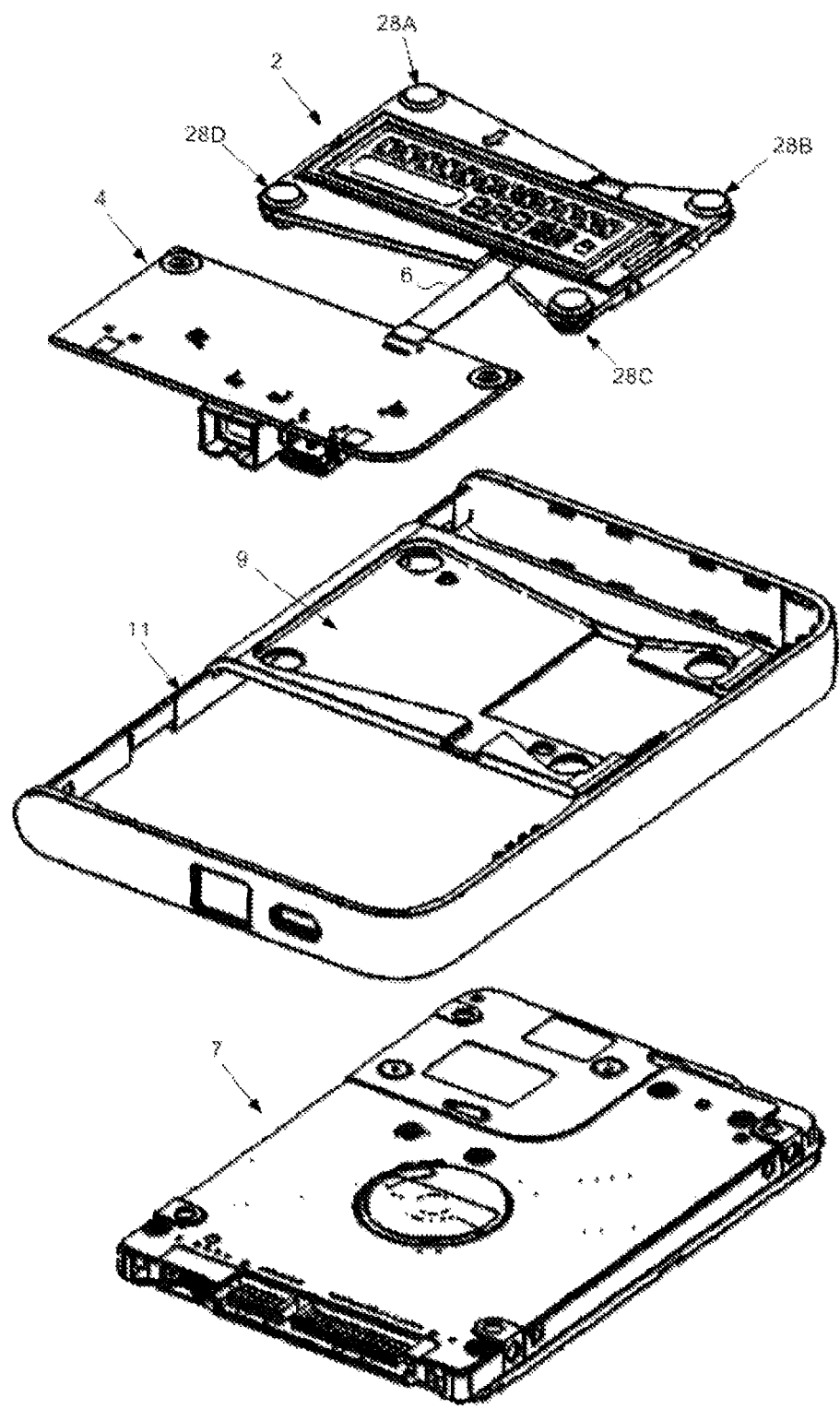
FIG. 1B shows internal components of the portable disk drive including the electronic display assembly coupled to a printed circuit board according to an embodiment of the present invention.
Figure 2:
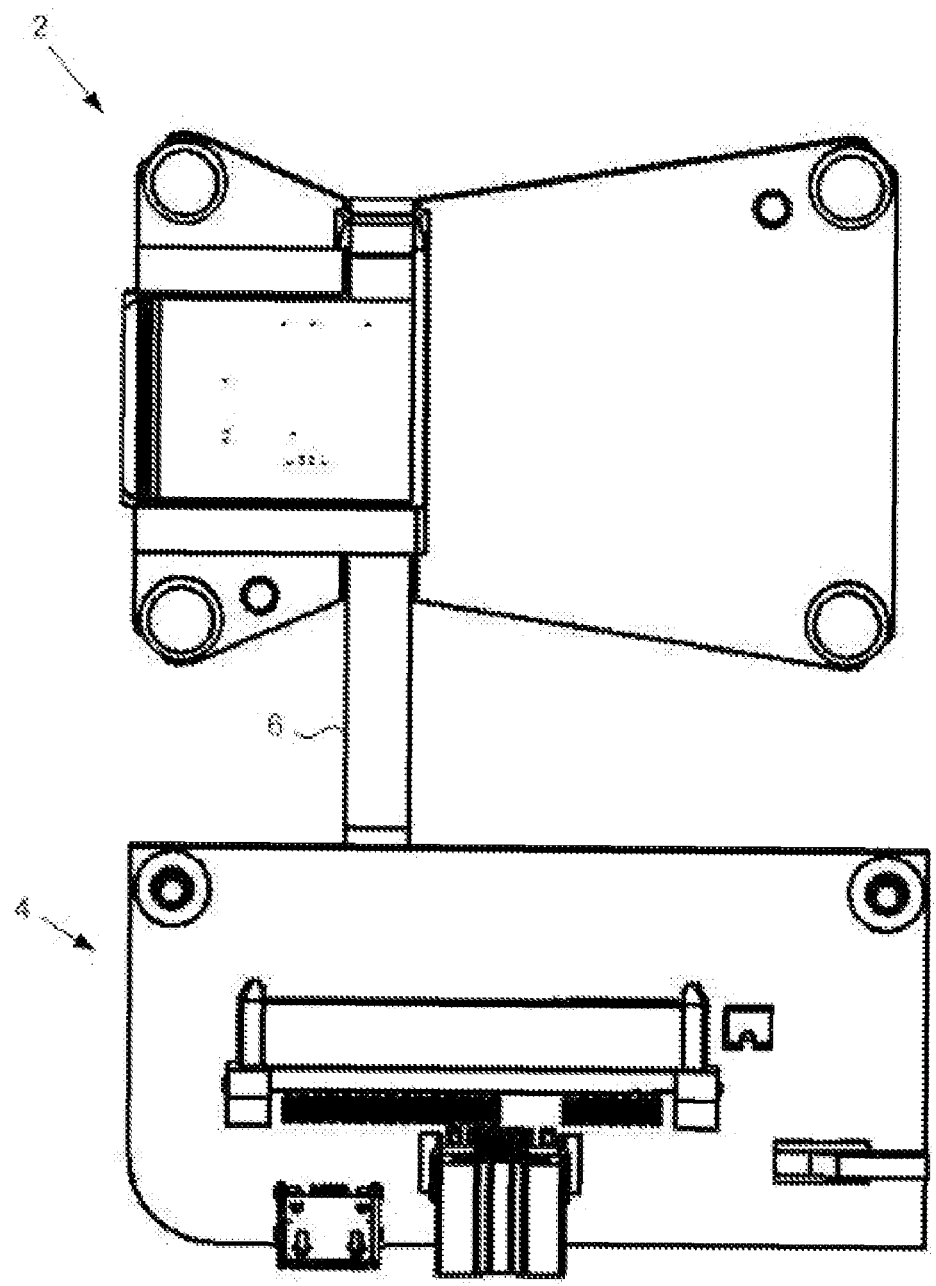
FIG. 2 shows a rear view of the electronic display assembly connected to the printed circuit board using a connector tab according to an embodiment of the present invention.

FIGS. 1A and 1B illustrate an embodiment of an electronic device in the form of a portable disk drive employing an electronic display assembly 2. The electronic display assembly 2 may comprise any suitable display device, such as a liquid crystal display (LCD). In addition, the LCD may implement any suitable display technology, such as a segmented LCD or a pixilated LCD. FIG. 1B shows internal components of the portable disk drive including the electronic display assembly 2 coupled to a printed circuit board 4 using a connector tab 6 (such as a cable, flex circuit, or the like). The printed circuit board 4 is fastened to a hard disk drive (HDD) 7, and the electronic display assembly 2 is inserted into a supporting frame 9 integrally formed with a side enclosure 11 of the portable disk drive. An external housing of the portable disk drive (FIG. 1A) is installed around the HDD 7, supporting frame 9, electronic display assembly 2, and PCB 4 in a manner that allows at least some compression of shock absorbers 28A-D onto the top surface of the HDD 7, such as during an impact. The printed circuitry board 4 comprises suitable components for controlling the portable disk drive, including interfacing with a host computer, as well as displaying status information on the LCD (e.g., name of the disk drive, free space, locked/unlocked, etc.). FIG. 2 shows a rear view of the electronic display assembly 2 and printed circuit board 4.

FIG. 3A shows an exploded view of the electronic display assembly 2 comprising a display mount 8 having a generally planar surface 10A and a window 12. A first side of an adhesive strip 14A is adhered to the planar surface 10A of the display mount 8 and at least partially covering the window 12 of the display mount 8. The electronic display assembly 2 further comprises a flex circuit 16 coupled to a display 18 (e.g., an LCD). The flex circuit 16 may comprise any suitable material, such as a flexible plastic substrate (e.g., a suitable polyimide).

Figure 5A:
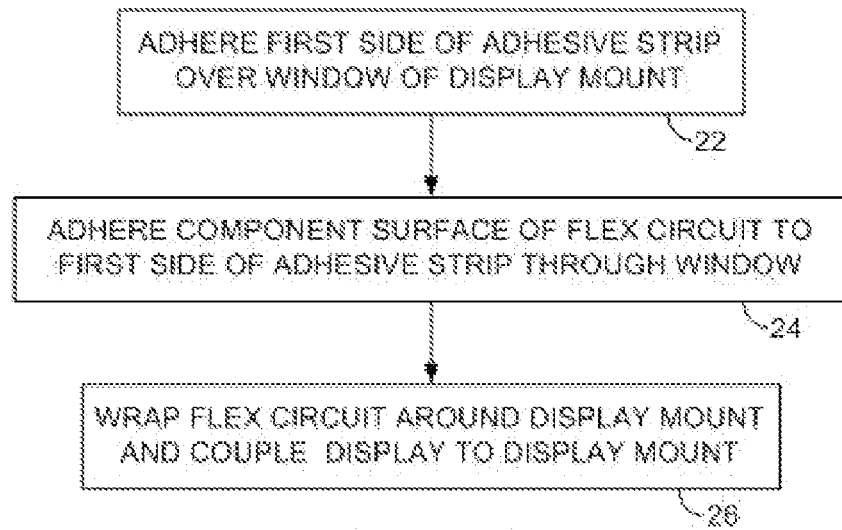
FIG. 5A is a flow diagram according to an embodiment of the present invention for manufacturing the electronic display assembly.

FIG. 3B shows a reverse exploded view of the electronic display assembly 2 including a component surface 20 of the flex circuit 16 having at least one component mounted thereon. An assembly method according to an embodiment of the present invention is disclosed in the flow diagram of FIG. 5A, wherein the first side of the adhesive strip 14A is adhered to the planar surface 10A of the display mount 8 and at least partially covering the window 12 (step 22). The component surface 20 of the flex circuit 16 is adhered to the first side of adhesive strip 14A through the window 12 (step 24). The flex circuit 16 is wrapped around the display mount 8 (along edge 8A) and the display 18 is coupled to the display mount 8 (step 26). The display 18 may be coupled to the display mount 8 using any suitable technique, such as with an adhesive applied to the second side of the adhesive strip 14A. In an alternative embodiment, the display 18 may be snapped into a recessed surface of the display mount 8 and held in place using suitable fasteners integrated with the recessed surface as illustrated in FIG. 3A, with screws, brackets, nuts and bolts, or other suitable attachment mechanism known to those of skill in the art. Using an adhesive to couple the display 18 to the display mount 8 may be preferred if snapping or otherwise securing the display 18 may cause undue stress on the display 18.

In the embodiment of FIG. 3A, a second adhesive strip 14B helps adhere the display 18 to a second planar surface 10B of the display mount 8. Accordingly, the term "adhesive strip" should be construed as a single strip or multiple strips, wherein in one embodiment at least one of the strips comprises a suitable adhesive on both sides for adhering the display 18 to the display mount 8. Additionally, adhesive strips 14A and 14B may be portions of a single adhesive strip, in an embodiment.

Also in the embodiment of FIG. 3A a plurality of optional shock absorbers 28A-D (e.g., rubber pegs) are used to space the electronic display assembly 2 from a mounting surface of an electronic device (e.g., to the internal HDD 7 of the portable disk drive shown in FIG. 1A). For example, an enclosure of the electronic device may compress the shock absorbers 28A-D onto an internal mounting surface. The shock absorbers 28A-D help prevent damage to the electronic display assembly 2 (particularly the LCD 18) due to physical shocks and bending torque as a user handles the electronic device. The shock absorbers 28A-D are preferably of a size and shape that provides spacing between the display mount 8 and other elements enclosing the display mount 8 in a final build (such as the internal HDD 7 of FIG. 1A). By way of example only, the shock absorbers 28A-D may help the display mount 8 "float" between the enclosure of the portable disk drive and the internal HDD 7. In other embodiments, the shock absorbers 28A-D may provide spacing on only one side or the other of the display mount 8.

In some embodiments as shown in FIG. 3B, the window 12 of the display mount 8 comprises a thickness substantially equal to a height of the component(s) mounted to the component surface 20 of the flex circuit 16. This facilitates adhering at least a portion of the component surface 20 to the first side of the adhesive strip 14A as well as creates a protective chamber for the component(s). Also in the embodiment of FIG. 3B, a thickness at edge 8A of the display mount 8 corresponds to at least a minimum bend radius of the flex circuit 16. That is, to help prevent damage to the flex circuit 16 the bend radius may be constrained depending on the materials and construction of the flex circuit to help prevent undue strain that may cause crimping, cracking, or creasing of the flex circuit 16. For example, a typical constraint placed on flex circuits may be at least a 10:1 ratio of bend radius to flex circuit thickness for a single sided flex circuit, and at least a 20:1 ratio of bend radius to flex circuit thickness for a double sided flex circuit. Therefore, the display mount 8 preferably is manufactured with a suitable thickness at edge 8A to facilitate this minimum bend radius. Also in the embodiment of FIG. 3A, the edge 8A of the display mount 8 is curved with a radius that is greater than or equal to the minimum bend radius of the flex circuit 16 described so as to provide the flex circuit 16 with a substantially continuous mounting surface which may help protect the flex circuit 16 from crimping, cracking, or other damage during and after manufacture of the electronic display assembly 2, as well as during and after installation into the electronic device (e.g., the portable disk drive of FIG. 1A).

Figure 5B:
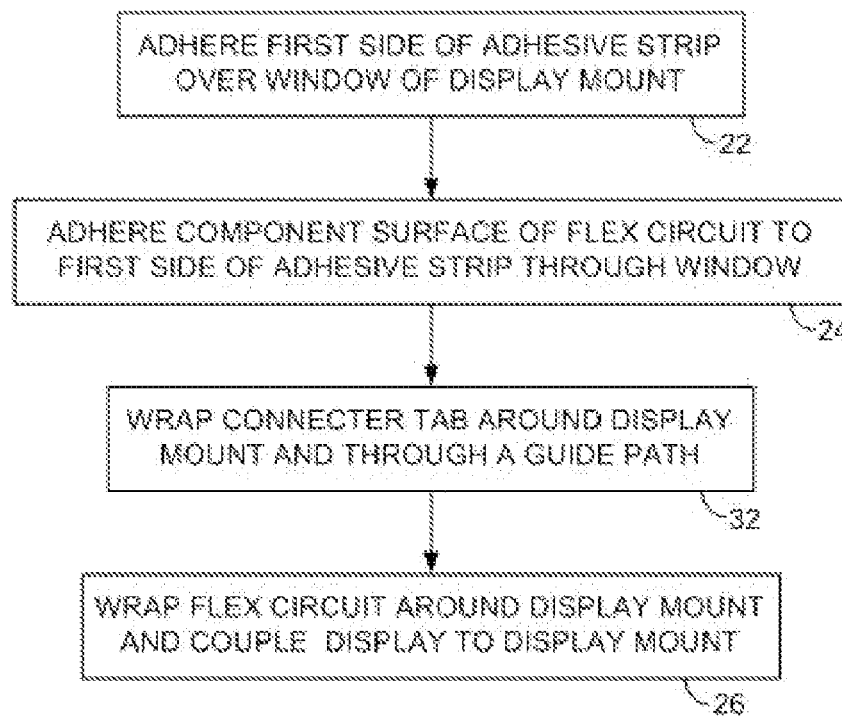
FIG. 5B is a flow diagram according to an embodiment of the present invention wherein a connector tab is optionally wrapped around the display mount and passing through a guide path defined between the display and the display mount.

The embodiment of FIG. 3A shows a connector tab 6 which may be optionally wrapped around the display mount 8 and passed through a guide path 30 formed between the display 18 and the display mount 8. FIG. 5B is a flow diagram showing the manufacturing steps according to this embodiment, wherein after adhering the component surface 20 of the flex circuit 16 to the first side of the adhesive strip 14A, the connector tab 6 is wrapped around the display mount 8 (along edge 8B) and passed through the guide path 30 formed between the display 18 and the display mount 8 (step 32). The flex circuit 16 is then wrapped around the display mount 8 (along edge 8A) and the display 18 is coupled to the display mount 8 (step 26).

In one embodiment, the display mount 8 (along edge 8B) comprises a thickness that facilitates the minimum bend radius of the connector tab 6 to prevent undue strain on the flex circuit that could lead to damage through a bending radius that is too small. As shown in FIGS. 3A and 3B, the edge 8B may be augmented as well as curved, preferably with respect to the minimum bend radius of the connector tab 6, to form a substantially continuous mounting surface for the connector tab 6, thereby protecting the connecter tab 6 from crimping, cracking or other damage.

Figure 3C:
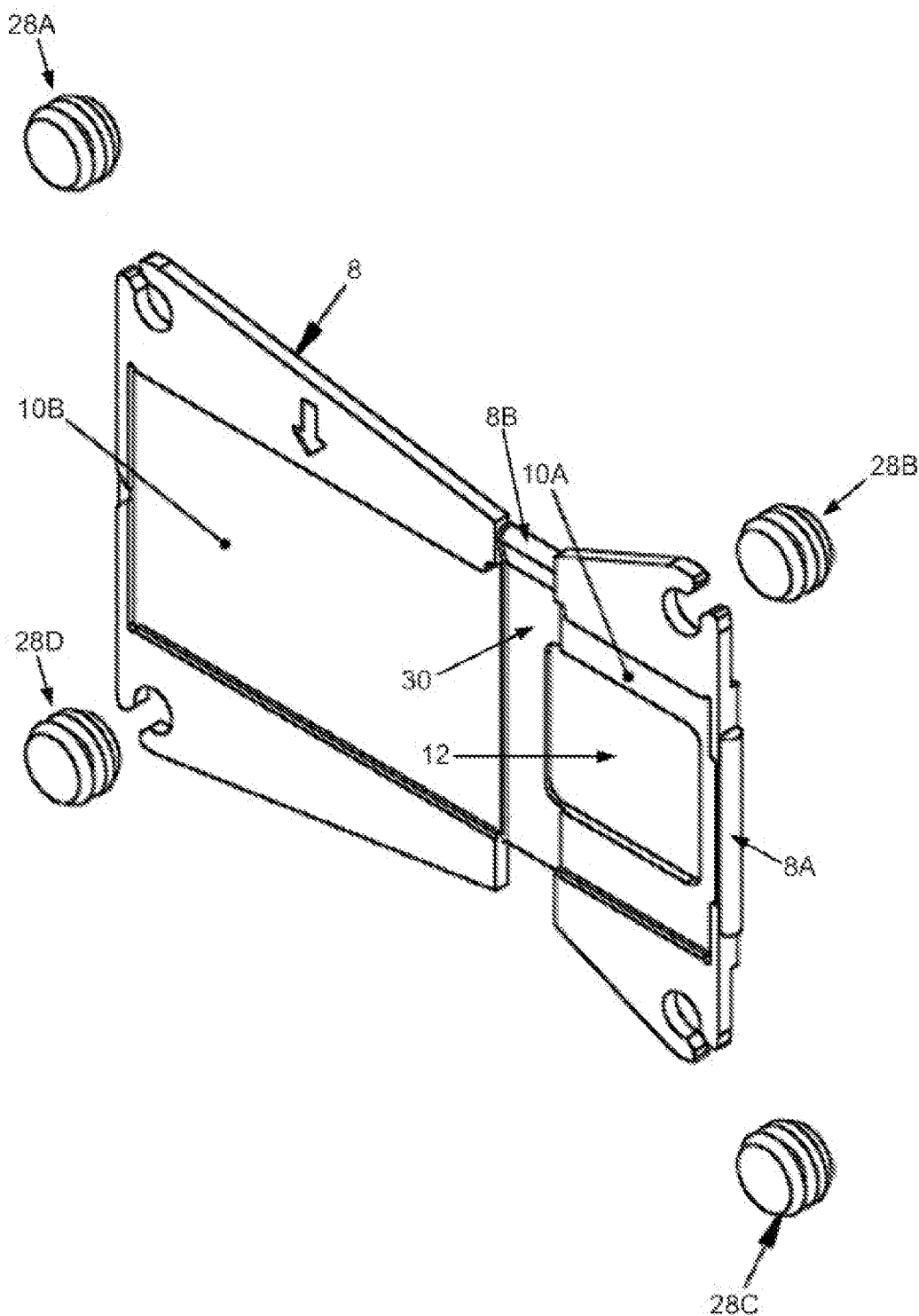
FIG. 3C shows a magnified, perspective view of the display mount including certain optional features, such as recessed, planar surfaces for mounting the display, a window, a guide path for the connector tab, and bend edges for supporting the flex circuit.

FIG. 3C shows a magnified, perspective view of the display mount 8 including some of the salient features, such as the planar surfaces 10A and 10B for mounting the display 18, the window 12, the guide path 30 for the connector tab 6, and the bend edges 8A and 8B for supporting the flex circuit 16. FIG. 3C also shows an embodiment wherein the display 18 may be snapped into a recessed surface of the display mount 8 in addition to, or instead of, adhering the display 18 using adhesive applied to the adhesive strip 14A, 14B. Additionally, in an embodiment, the recessed surface of the display mount 8 may be of sufficient depth for the display 18 to sit flush with or within the recessed portion of the display mount when assembled. This feature may provide additional protection for the display. Not all of the features of the display mount 8 shown in FIG. 3C are necessary to practice certain embodiments of the invention. In addition, the features of the display mount 8 may be formed in any suitable manner. In one embodiment, the display mount 8 may be formed using a suitable injection molding technique, such as by injection molding plastic.

Figure 4A:
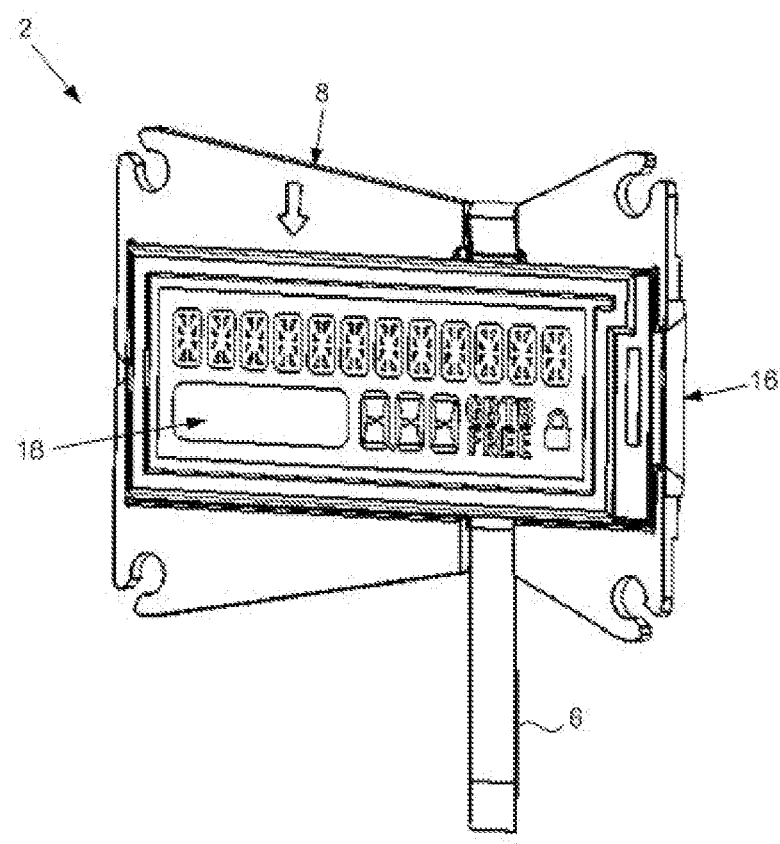
FIG. 4A shows a perspective view of the electronic display assembly including the flex circuit wrapped around the display mount according to an embodiment of the present invention.
Figure 4B:
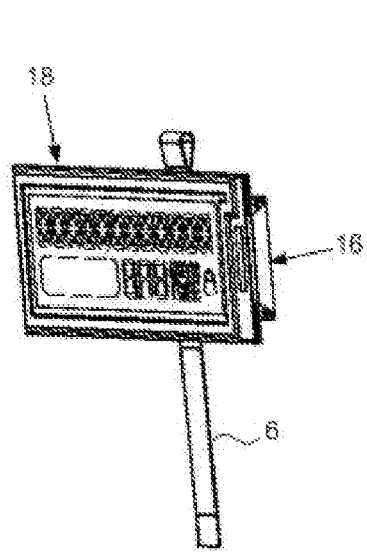
FIGS. 4B and 4C show perspective views of the flex circuit and display without the display mount.
Figure 4C:
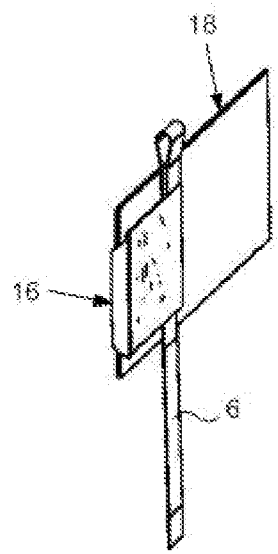

FIG. 4A shows a perspective view of the electronic display assembly 2 including the display 18 mounted to the display mount 8 and the flex circuit 16 wrapped around the display mount 8. FIG. 4A also illustrates the connector tab 6 wrapped around the display mount 8 and passing through the guide path formed between the display 18 and the display mount 8. FIGS. 4B and 4C show the display 18 and flex circuit 16 in their assembled configuration without showing the display mount 8.

The manufacturing process of the electronic display assembly 2 may vary depending on the embodiment. For example, in an embodiment where the connector tab 6 of the flex circuit 16 is not wrapped around the display mount 8, the display 18 may be coupled to the display mount 8 first (e.g., adhered and/or snapped), the flex circuit 16 then wrapped around the display mount 8 (at edge 8A), and then the component surface 20 of the flex circuit 16 adhered to the first side of the adhesive strip 14A through the window 12 of the display mount 8. Additionally, if the guide path 30 is of sufficient depth, the connector tab 6 may also be wrapped around the display mount 8 (at edge 8B) and fed through the guide path 30 after the display 18 is coupled to the display mount 8. In such a case, a portion of adhesive strip 14A,B may or may not help secure the connector tab 6 in place within the guide path 30.

Although the foregoing has been described in terms of certain embodiments, other embodiments will be apparent to those of ordinary skill in the art from the disclosure herein. For example, the adhesive strip(s) 14A,B may comprise single- or double-sided tapes, glues, cements, combinations of the same, or the like. In other embodiments, the display mount 8 may comprise a single integrated piece (such as an injected molded plastic), or multiple components assembled using snapping, gluing, or other suitable techniques. In one embodiment, the flex circuit 16 may comprise a substantially constant density, thickness, and composition that makeup the component surface 20 as well as the bend surface(s) that bend around the display mount 8. In an alternative embodiment, the flex circuit 16 may comprise a different density, thickness, and/or composition at the bending surface(s) to help protect against crimping, cracking, creasing, or other damage. In the embodiment of FIG. 3A, the display 18 is shown as covering the entire window 12 of the display mount 8, but in other embodiments the display 18 may not cover the window 12, or may cover only a portion of the window 12. In addition, the process of assembling the electronic display assembly 2 may be performed manually or through automation, or a combination of both. Any suitable display technology may be employed in the embodiments of the present invention, such as any suitable backlit display, e-Paper, etc. In addition, the electronic display assembly disclosed herein may be incorporated into any suitable electronic device, such as solid state drives, cell phones, smart phones, music players, game players, etc.

The described embodiments have been presented by way of example only and are not intended to limit the scope of the disclosure. Indeed, the novel methods and systems described herein may be embodied in a variety of other forms without departing from the spirit thereof. Thus, the invention is not limited by any preferred embodiments, but is defined by reference to the appended claims.

What is claimed is:

1. An electronic display assembly comprising:
   a display mount comprising a window and a display coupled to the display mount;
   an adhesive strip comprising a first side at least partially covering the window of the display mount; and
   a flex circuit coupled to the display, wherein:
      the flex circuit comprises a component surface having at least one component mounted thereon; and
      the flex circuit is wrapped around the display mount and the component surface is adhered to the first side of the adhesive strip through the window of the display mount.

2. The electronic display assembly as recited in claim 1, wherein the display is coupled to the display mount by an adhesive applied to a second side of the adhesive strip.

3. The electronic display assembly as recited in claim 1, wherein the display is coupled to the display mount by snapping the display into a recessed surface of the display mount.

4. The electronic display assembly as recited in claim 1, wherein the display comprises a liquid crystal display.

5. The electronic display assembly as recited in claim 1, wherein the window of the display mount comprises a thickness substantially equal to a height of the component.

6. The electronic display assembly as recited in claim 1, wherein a thickness of at least a portion of the display mount about which the flex circuit is wrapped is greater than or equal to twice a minimum bend radius of the flex circuit.

7. The electronic display assembly as recited in claim 6, wherein the minimum bend radius is at least ten times the thickness of the flex circuit.

8. The electronic display assembly as recited in claim 1, wherein:
   the flex circuit comprises a connector tab wrapped around the display mount and passed through a guide path formed between the display and the display mount; and
   the connector tab operable to connect to a printed circuit board.

9. The electronic display assembly as recited in claim 8, wherein a thickness of a second portion of the display mount is greater than or equal to twice a minimum bend radius of the connector tab.

10. The electronic display assembly as recited in claim 9, wherein the minimum bend radius is defined relative to a thickness of the connector tab.

11. The electronic display assembly as recited in claim 1, further comprising a plurality of shock absorbers for protecting the display mount within a frame of an electronic device.

12. The electronic display assembly as recited in claim 11, wherein the electronic device comprises a portable disk drive.

13. A method of manufacturing an electronic display assembly, the method comprising:
   adhering a first side of an adhesive strip over a window of a display mount;
   adhering a component surface of a flex circuit to the first side of the adhesive strip through the window, wherein the flex circuit is coupled to a display; and
   wrapping the flex circuit around the display mount and coupling the display to the display mount.

14. The method as recited in claim 13, wherein the display is coupled to the display mount by an adhesive on a second side of the adhesive strip.

15. The method as recited in claim 13, wherein the display is coupled to the display mount by snapping the display into a recessed surface of the display mount.

16. The method as recited in claim 13, wherein the display comprises a liquid crystal display.

17. The method as recited in claim 13, wherein the window of the display mount comprises a thickness substantially equal to a height of components mounted to the component surface of the flex circuit.

18. The method as recited in claim 13, wherein a thickness of the display mount is greater than or equal to twice a minimum bend radius of the flex circuit.

19. The method as recited in claim 18, wherein the minimum bend radius is defined relative to a thickness of the flex circuit.

20. The method as recited in claim 19, wherein the minimum bend radius is at least twenty times the thickness of the flex circuit.

21. The method as recited in claim 13, wherein the flex circuit comprises a connector tab, further comprising wrapping the connector tab around the display mount and passing through a guide path formed between the display and the display mount.

22. The method as recited in claim 21, wherein a thickness of a second part of the display mount is greater than or equal to twice a minimum bend radius of the connector tab.

23. The method as recited in claim 22, wherein the minimum bend radius is defined relative to a thickness of the connector tab.

24. The method as recited in claim 13, further comprising mounting the electronic display assembly to a frame of an electronic device using a plurality of shock absorbers.

25. The method as recited in claim 24, wherein the electronic device comprises a portable disk drive.

* * * * *